(12) United States Patent
Nakajima et al.

(10) Patent No.: US 8,927,850 B2
(45) Date of Patent: Jan. 6, 2015

(54) PHOTOVOLTAIC MODULE

(75) Inventors: Takaaki Nakajima, Kaizuka (JP);
Shihomi Nakatani, Kaizuka (JP);
Shingo Okamoto, Toyonaka (JP)

(73) Assignee: SANYO Electric Co., Ltd.,
Moriguchi-Shi (JP)

( * ) Notice: Subject to any disclaimer, the term of this patent is extended or adjusted under 35 U.S.C. 154(b) by 849 days.

(21) Appl. No.: 11/727,072

(22) Filed: Mar. 23, 2007

(65) Prior Publication Data

US 2007/0227580 A1  Oct. 4, 2007

(30) Foreign Application Priority Data

Mar. 31, 2006 (JP) ................................. 2006-099978
Feb. 6, 2007 (JP) ................................. 2007-027067

(51) Int. Cl.
*H02N 6/00* (2006.01)
*H01L 31/05* (2014.01)
*H01L 31/048* (2014.01)

(52) U.S. Cl.
CPC .............. *H01L 31/05* (2013.01); *H01L 31/048* (2013.01); *Y02E 10/52* (2013.01)
USPC ........................................................ 136/244

(58) Field of Classification Search
USPC ................................................. 136/252, 244
See application file for complete search history.

(56) References Cited

U.S. PATENT DOCUMENTS

| | | | | |
|---|---|---|---|---|
| 4,487,989 | A * | 12/1984 | Wakefield et al. | ............. 136/256 |
| 5,990,415 | A * | 11/1999 | Green et al. | .................... 136/255 |
| 6,218,606 | B1 | 4/2001 | Morizane et al. | |
| 6,235,984 | B1 | 5/2001 | Wambach et al. | |
| 2003/0006730 | A1 | 1/2003 | Tachibana | |
| 2003/0127124 | A1 * | 7/2003 | Jones et al. | .................... 136/244 |
| 2004/0200522 | A1 * | 10/2004 | Fukawa et al. | ................ 136/259 |

FOREIGN PATENT DOCUMENTS

| | | |
|---|---|---|
| DE | 91 10 719 U1 | 12/1991 |
| EP | 1 041 647 A1 | 10/2000 |
| JP | 61-082485 A | 4/1986 |
| JP | 09-326497 A | 12/1997 |
| JP | 11354822 | 12/1999 |
| JP | 2000-101122 A | 4/2000 |
| JP | 2000-174314 A | 6/2000 |
| JP | 2001-250965 A | 9/2001 |
| JP | 2001-308361 | 11/2001 |
| JP | 2002-359388 A | 12/2002 |
| JP | 2003-086820 A | 3/2003 |
| JP | 2005-079170 | 3/2005 |
| JP | 2005-209985 A | 8/2005 |
| JP | 2006019440 | 1/2006 |
| JP | 2006-73706 | 3/2006 |

OTHER PUBLICATIONS

Machine translation of JP2001250965.*
Chinese Office Action from corresponding case, dated Jan. 8, 2010; English translation included.
Notification of Reason(s) of Refusal from a corresponding application, dated Apr. 20, 2010; English translations included.
Office action issued Jun. 4, 2013 in a corresponding Japanese Patent Application No. 2011-156346.
English language abstract of JP 2003-086820 A published Mar. 20, 2003.

* cited by examiner

*Primary Examiner* — Rebecca Lee
(74) *Attorney, Agent, or Firm* — NDQ&M Watchstone LLP

(57) ABSTRACT

It is an object of the present invention to provide a photovoltaic module capable of reducing an area occupied by interconnectors. The photovoltaic module of the present invention comprises light-transmitting substrate, strings including a plurality of solar cells interconnected through tab connector, and rear surface member. A plurality of the strings is electrically connected through interconnectors and arranged on a rear surface side so as not to overlap each other. The photovoltaic module is sealed with a sealant between the light-transmitting substrate and the rear surface member.

12 Claims, 18 Drawing Sheets

US 8,927,850 B2

PHOTOVOLTAIC MODULE

The priority applications Numbers JP2006-99978 and JP2007-27067, upon which this patent application is based are hereby incorporated by reference.

BACKGROUND OF THE INVENTION

1. Field of the Invention

The present invention relates to a photovoltaic module, and more particularly, to a photovoltaic module in which a plurality of solar cells is sealed with a sealant between a light-transmitting substrate and a rear surface member.

2. Description of Related Art

From the viewpoint of global environment, attention is being given to solar cells that can convert light from the sun, which is a clean inexhaustible energy source, directly into electricity.

Because a single solar cell outputs as small as a few watts, generally a plurality of solar cells is electrically connected in series to enhance the output to a few hundreds watts and used as a photovoltaic module to power houses and buildings.

The conventional photovoltaic module will be descried according to FIGS. 20 and 21. FIG. 20 is a cross-sectional view partially illustrating the structure of the conventional photovoltaic module. FIG. 21 is a plan view illustrating the conventional photovoltaic module.

As illustrated in FIG. 20, a plurality of solar cells 800 is electrically interconnected through tab connectors 802 composed of an electrically-conductive material such as copper foil. The solar cells 800 are sealed with a light-transmitting sealant 840 such as EVA (Ethylene Vinyl Acetate) having excellent weather resistance and moisture resistance between a light-transmitting front surface member 830 such as glass and light-transmitting plastic and a rear surface member 820 composed of a water weather-resisting film.

As illustrated in FIG. 21, the plurality of solar cells 800 is connected in series through the tab connectors 802 so as to form a unit (strings) 810. Connectors, so-called interconnectors 811 are used for connecting between these units 810, 810. These interconnectors 811 are arranged surrounding the solar cells 800. Additionally, lead-out wires are connected with the interconnectors 811 inside a terminal box (not shown) so as to draw an output from these solar cells 800 to the outside.

As mentioned above, the photovoltaic submodule is formed. Then, a photovoltaic module will be structured by arranging a metallic outer frame 850 surrounding the photovoltaic submodule.

In the aforementioned photovoltaic submodule, the front surface member 830, a front surface side sealing material sheet, the tab connectors 802, the plurality of solar cells 800 connected through, for example, the interconnectors 811, a rear surface side sealing material sheet, and the rear surface member 820 are laminated in this order, set in a equipment, a so-called laminator, and then pressed to be integrated, while being heated under reduced pressure.

It is preferred that the aforementioned interconnectors 811 have large cross-sectional area in order to reduce resistance loss. These interconnectors 811 are arranged at the periphery of the units 810. Therefore, when an area occupied by the interconnectors 811 is increased, an area of the photovoltaic submodule is increased by that much. This reduces a share of a power generating region of a module area (light-receiving area). As a result, module efficiency is reduced.

From the viewpoint of module efficiency, the interconnectors 811 have conventionally a reduced line width and an increased thickness in order to reduce the resistance loss.

A fully solder-coated copper foil having a thickness of approximately 300 μm and a width of approximately 2 mm to 7 mm is cut into a specified length. The cut one is used for the aforementioned conventional interconnectors 811.

A proposed photovoltaic module includes unnoticeable interconnectors arranged surrounding solar cells. It improves the whole appearance design of building and the like, in which the photovoltaic module is provided. (e.g. Japanese unexamined patent publication No. 2005-79170) The photovoltaic module described in the Japanese unexamined patent publication is structured to arrange a colored light-receiving-side charging material at the periphery end of the photovoltaic module, thereby hiding the interconnectors and the like.

BRIEF SUMMARY OF THE INVENTION

The aforementioned photovoltaic module has a problem that the module efficiency is lower due to an area which is not contributory to power generation occupied by the interconnectors.

The aforementioned photovoltaic module is integrated by using lamination equipment. When the interconnectors located at the periphery have an increased thickness or an overlapping part of these interconnectors is existed, it causes a generation of air bubbles when laminating. Then, the generation of air bubbles reduces the yield of manufacturing process.

It is therefore a first object of the present invention to provide a photovoltaic module capable of reducing an area occupied by the interconnectors.

It is further a second object of the present invention to provide a photovoltaic module capable of reducing stress on the solar cell when laminating and preventing air bubbles from frequently generating when laminating and the solar cell from cracking.

The photovoltaic module of the present invention is characterized by composing a light-transmitting substrate, a unit including a plurality of solar cells connected through a tab connector, and a rear surface member. The plurality of the units is electrically connected through interconnectors. The photovoltaic module is sealed with a sealant between the light-transmitting substrate and the rear surface member. The interconnectors are arranged on the rear surface side.

The interconnectors are preferably arranged on the rear surface side of the solar cell so as not to overlap each other.

For the interconnectors, a metal foil coated with a laminated film having self-adhesiveness is preferably used.

Additionally, the unit is interconnected through the tab connectors with the solar cells arranged on the same surfaces side having alternately reversed polarity. The solar cells of adjacent units are characterized by the alternately reversed polarity.

For the aforementioned interconnectors, a wide tab connector having a line width which is not less than two hundreds times a film thickness is preferably used. For the aforementioned interconnectors, a metal foil having a film thickness which is not less than 100 μm and not more than 300 μm is preferably used.

The interconnectors are preferably arranged leaving a space of not less than 2 mm.

The present invention can reduce the area occupied by the interconnectors. It improves the module efficiency by arranging the interconnectors on the rear surface side of the solar cell.

The interconnectors are thin and arranged so as not to overlap each other. It prevents the air bubbles from generating. Since the interconnectors are wide and formed, the pressing strength applied under reduced pressure can be widely dispersed over the solar cell, thereby preventing the solar cell from cracking due to the stress concentration.

By using a metal foil coated with a laminated film having self-adhesiveness for the interconnectors, the insulator or the like can be fixed and the unit or the like can be temporarily fixed. Therefore, the photovoltaic module can be easily assembled.

Additionally, the interconnectors can have further increased width by alternately reversing the polarity of the solar cells of the adjacent units. It reduces the interconnector resistance.

DETAILED DESCRIPTION OF THE PREFERRED EMBODIMENTS

Figure 1:
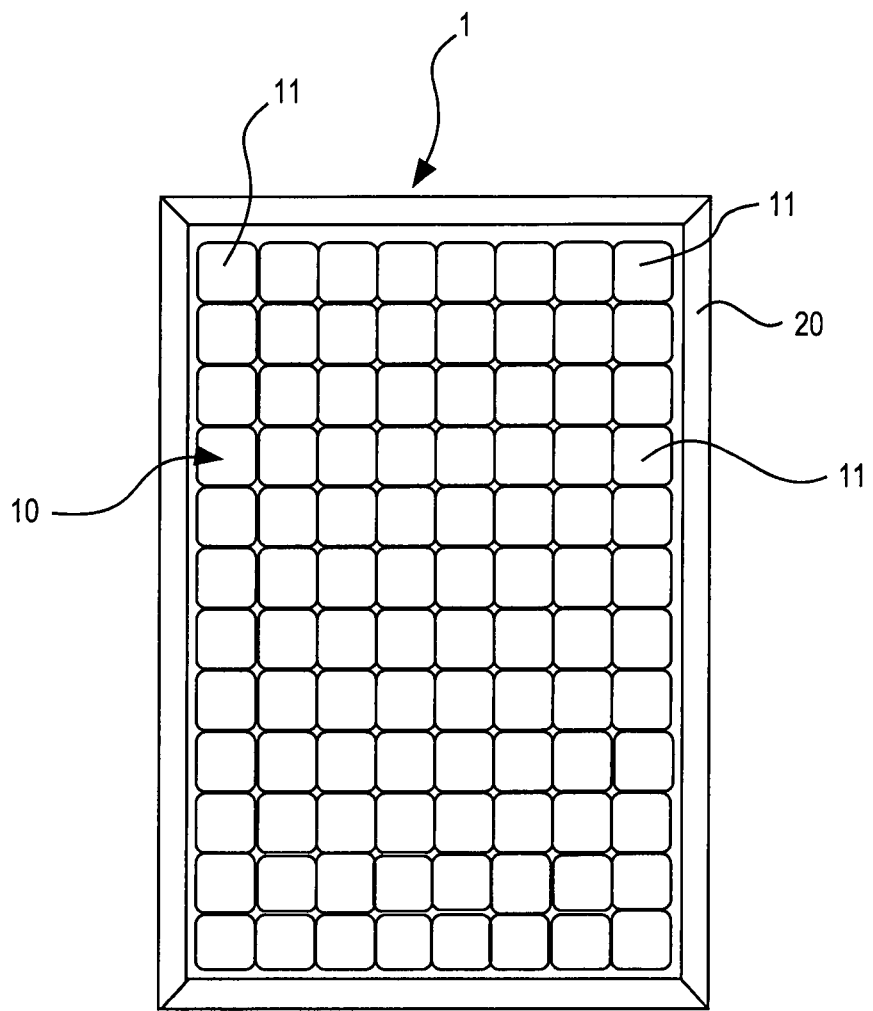
FIG. 1 is a plan view illustrating a schematic photovoltaic module according to the embodiment of the present invention.

With reference to the drawings, detailed descriptions will be made on an embodiment of the present invention. Components identical or equivalent to each other in the drawings are denoted the same reference number, and will not be further explained to avoid repetition.

Figure 2:
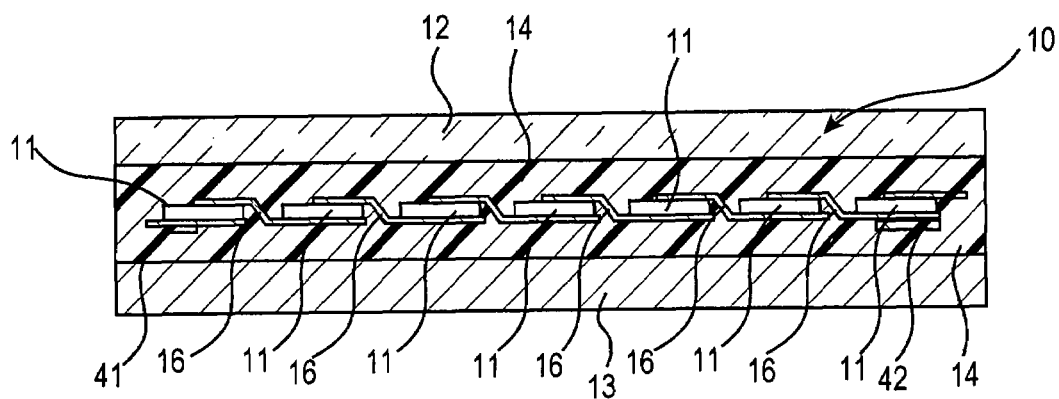
FIG. 2 is a schematic cross-sectional view illustrating a photovoltaic submodule used for the photovoltaic module in the present invention.

FIG. 1 is a plan view illustrating a schematic photovoltaic module according to the embodiment of the present invention. FIG. 2 is a schematic cross-sectional view illustrating a photovoltaic submodule 10 used in the photovoltaic module of the present invention.

As illustrated in FIGS. 1 and 2, the photovoltaic module 1 of the present invention comprises a plurality of solar cells 11. For the solar cells 11, a crystalline solar cell composed of single crystalline silicon, multicrystalline silicon, or the like, a solar cell in which a substantially intrinsic amorphous silicon layer is sandwiched between a single crystal silicon substrate and an amorphous silicon layer, or the like can be used. In the aforementioned solar cell, the defects on interfaces with the intrinsic amorphous silicon layer are reduced, thereby improving the property of the hetero junction interfaces. The aforementioned photovoltaic module 1 comprises a board-shaped photovoltaic submodule 10 which includes the plurality of solar cells 11 and an outer frame 20. The outer frame 20 is composed of, for example, aluminum which is set through a sealing material on the periphery of the photovoltaic submodule 10.

Each of the plurality of adjacent solar cells 11 is interconnected in series through tab connectors 16 composed of, for example, flat copper foil. That is, the tab connector 16 has one end connecting to collector electrode on a upper surface side of a given solar cell 11 and the other end connecting to collector electrode on a lower surface side of another solar cell 11 adjacent to the given solar cell 11. Thus, the plurality of solar cells 11 is electrically interconnected through the tab connectors 16 composed of the electrically-conductive material such as copper foil. The plurality of solar cells 11 is then sealed using a light-transmitting sealant 14 such as EVA (Ethylene Vinyl Acetate) having excellent weather resistance and moisture resistance between a light-transmitting front surface member 12 such as glass and light-transmitting plastic and a rear surface member 13 composed of the water weather-resisting film.

As mentioned above, although various types of solar cells, for example, crystalline type and amorphous type can be used for the solar cell 11, attention is being given to a type of solar cell capable of reducing power generation losses in defective regions on the front surface of the solar cell and realizing high power output. This solar cell has substantially i-type amorphous silicon layers, which means without dopant, each formed between a crystalline substrate and a p-type amorphous silicon layer and between the crystalline substrate and an n-type amorphous silicon layer in order to improve interface properties. These solar cells are interconnected in series through tab connectors and formed so as to generate a predetermined output, for example an output of 200 W, through interconnectors and lead-out wires from the photovoltaic submodule 10.

Figure 3:
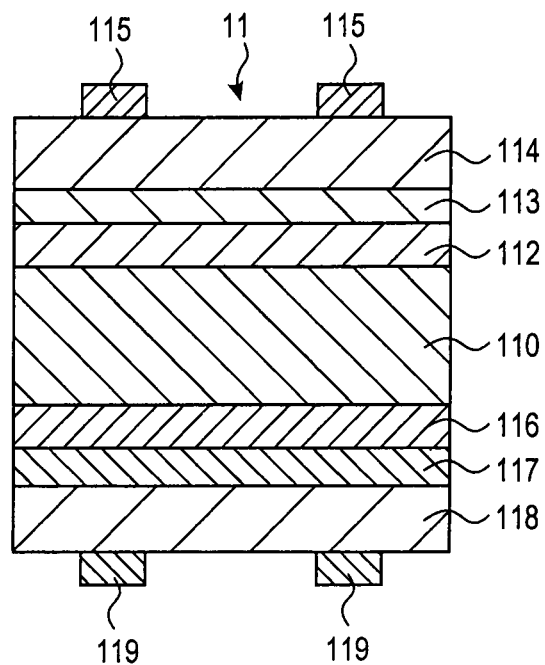
FIG. 3 is a schematic cross-sectional view illustrating a solar cell used in the embodiment of the present invention.

A structure of the aforementioned solar cell 11 will be described with reference to FIG. 3. FIG. 3 is a schematic cross-sectional view illustrating the solar cell used in the embodiment. For an easier understanding of the structure of each layer, thin layers are enlarged in FIG. 3 regardless of the proportion according to an actual thickness of each layer.

As illustrated in FIG. 3, the solar cell 11 comprises an n-type single crystalline silicon substrate 110 having a thickness of approximately 300 μm, as a crystalline semiconductor substrate. There are pyramidal projections and depressions (not shown) having a height of a few micro meters to several tens of micro meters on a surface of the n-type single crystalline silicon substrate 110. The projections and depressions are made for confining light. A substantially intrinsic i-type amorphous silicon layer 112 is formed on the n-type single crystalline silicon substrate 110. Additionally, a p-type amorphous silicon layer 113 is formed on the i-type amorphous silicon layer 112.

An ITO (Indium Tin Oxide) film 114 is formed on the p-type amorphous silicon layer 113 by a sputtering method.

Comb-shaped collector electrodes 115 composed of silver paste are formed each at a predetermined region on an upper surface of the ITO film 114. Each collector electrodes 115 comprises bus bar portion and finger portion. Tab connectors are connected to the bus bar portion.

An i-type amorphous silicon layer 116 is formed on a lower surface of the n-type single crystalline silicon substrate 110. An n-type amorphous silicon layer 117 is formed on a lower surface of the i-type amorphous silicon layer 116. Thus, the so-called Back Surface Field (BSF) structure is formed by laminating the i-type amorphous silicon layer 116 and the n-type amorphous silicon layer 117 in this order on the lower surface of the n-type single crystalline silicon substrate 110. Additionally, an ITO film 118 is formed by the sputtering method on the n-type amorphous silicon layer 117.

Comb-shaped collector electrodes 119 composed of silver paste are formed each at a predetermined region on the ITO film 118. Each collector electrodes 119 comprises bus bar portion and finger portion. Tab connectors are connected to the bus bar portion.

Figure 4:
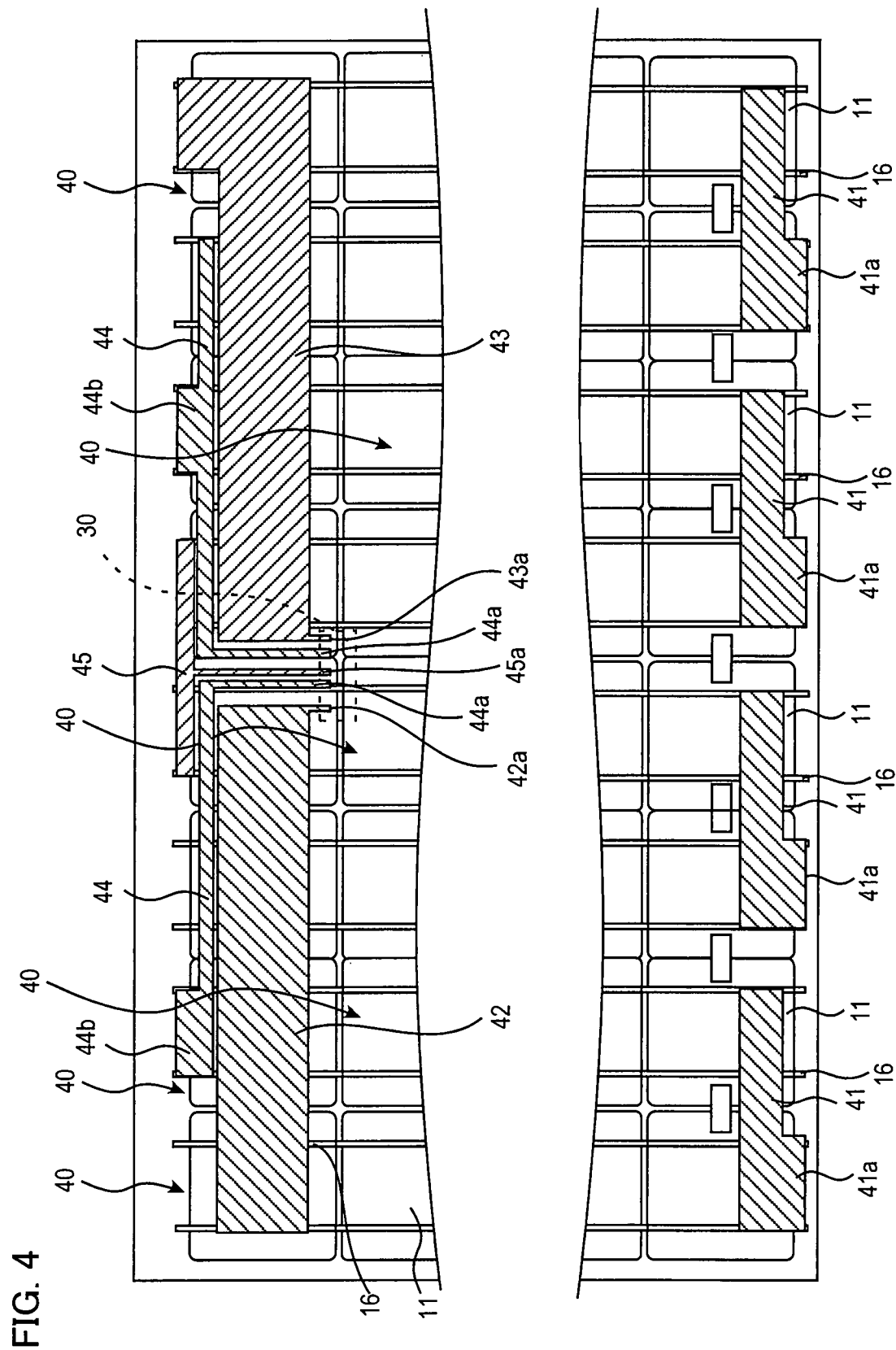
FIG. 4 is a schematic plan view seeing from the rear surface side illustrating a connection status between strings in the first embodiment of the present invention.

In the first embodiment as illustrated in FIG. 4, twelve solar cells 11 (the solar cells positioned in between are not shown in the figure) are connected in series through the tab connectors 16 so as to form a unit (strings 40). In the embodiment, eight such strings 40 are connected in series. In the photovoltaic module 1, the solar cells 11 are arranged in twelve series and in eight lines. This invention is also applicable, even though the number of series is increased or reduced, which means that the number of the solar cell 11 of the strings 40 is increased or reduced.

In the embodiment, the strings 40 are arranged so that p-type amorphous silicon layer 113 side of the solar cell 11 faces light-receiving surface side and the adjacent solar cells 11, 11 are interconnected through the tab connectors 16. The tab connector 16 has one end connected to collector electrode on a upper surface side of a given solar cell 11 and the other end connected to collector electrode on a lower surface side of another solar cell 11 adjacent to the given solar cell 11. Therefore, collector positive electrode is positioned on the front surface side and collector negative electrode is positioned on the rear surface side.

When the solar cell 11 is arranged so that the p-type amorphous silicon layer 113 side faces the light-receiving surface side as mentioned above, the solar cell 11 is structured suitable for such arrangement. In such arrangement, the each amorphous silicon layers has predetermined film thickness, film material, and the like for the optimal conversion efficiency.

Figure 5:
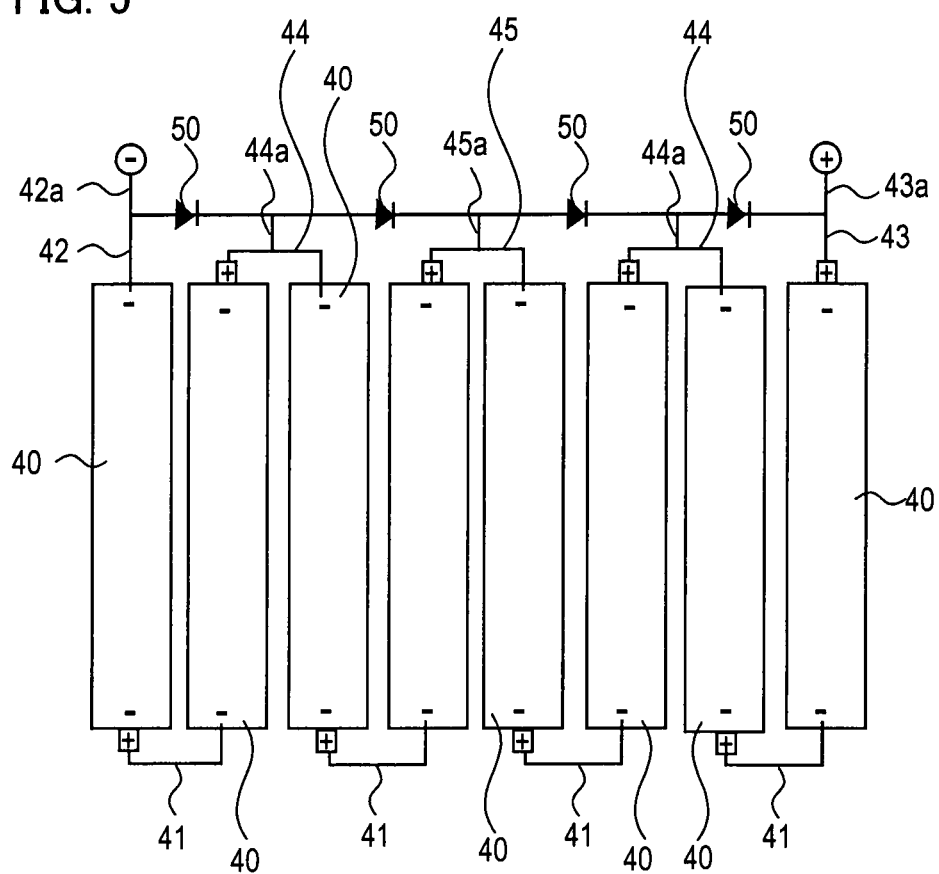
FIG. 5 is a circuit explanation view schematically illustrating the connection status between the strings in the first embodiment of the present invention.

A connection between the strings 40 in the first embodiment of the present invention will be further described below with reference to FIGS. 4 and 5. FIG. 4 is a schematic plan view seeing from the rear surface side illustrating the connection status between the strings 40 in the first embodiment of the present invention. FIG. 5 is a circuit explanation view schematically illustrating the connection status between the strings 40 in the first embodiment of the present invention.

As illustrated in FIG. 4, the interconnectors 41, 42, 43, 44, 45 connecting between the strings 40 are arranged on the rear surface of the solar cell 11, which means the rear surface side of the photovoltaic submodule 10. While the interconnectors are conventionally arranged surrounding the solar cell, the interconnectors 41, 42, 43, 44, 45 connecting between strings 40 are arranged on the rear surface of the solar cell 11 in the present invention.

The interconnector 41 connects the adjacent strings 40, 40 in series and connects from tab connector 16, which is arranged on a rear surface side, to tab connector 16, which is arranged on a front surface side. The interconnector 41 is used when connecting at the edge on the side opposite to the lead-out wire of the strings 40, 40. The interconnector 41 includes a wide connection 41a connecting with the tab connector 16, which is arranged on the front surface side, extending from an edge of the solar cell 11. In the embodiment, the interconnector 41 connects between tab connector 16 on the negative electrode side on the rear surface of the strings 40 and tab connector 16 on the positive electrode side on the front surface of the strings 40, which is positioned next to the aforementioned strings 40.

As illustrated in the lower part of FIGS. 4 and 5, the adjacent strings 40, 40 are connected through the interconnector 41.

The interconnectors 42, 43 are formed including lead-out wires. In the embodiment, the interconnector 42 has a lead-out wire connecting with the negative electrode, and the interconnector 43 has a lead-out wire connecting with the positive electrode.

The interconnector 42 has one end connecting with the tab connector 16, which is arranged on the rear surface side, of the strings 40 positioned at the most edge and the other end extending to a terminal box (not shown) as a lead-out wire 42a. In FIGS. 4 and 5, the interconnector 42 is connected with the tab connector 16, which is arranged on the rear surface side, of the solar cell 11 which is positioned at the upper edge of the far left in the figure. In the interconnector 42, an insulation layer is provided at a part correspond in position to other than the strings 40 positioned at the far left in order to prevent from short-circuiting between the other strings 40 and the tab connectors 16. The lead-out wire 42a is connected with a bypass diode 50 inside the terminal box.

The interconnector 43 for the positive electrode has one end connecting with the tab connector 16, which is arranged on the front surface side, of the strings 40 positioned at the most edge and the other end extending to the terminal box (not shown) as a lead-out wire 43a. In FIGS. 4 and 5, the interconnector 43 is connected with the tab connector 16, which is arranged on the front surface side, of the solar cell 11 which is positioned at the upper edge of the far right in the figure. In the interconnector 43, the insulation layer is provided at a part correspond in position to other than the strings 40 positioned at the far right in order to prevent from short-circuiting between the other strings 40 and the tab connectors 16. The lead-out wire 43a is connected with the bypass diode 50 inside the terminal box.

The interconnector 44 connects the adjacent strings 40 in series. The interconnector 44 includes a wide connection 44b connecting with the tab connector 16, which is arranged on the front surface side, extending from an edge of the solar cell 11, while connecting with the tab connector 16, which is arranged on the front surface side, at the edge of the solar cell 11 and the tab connector 16, which is arranged on the rear surface side, on the rear surface of the solar cell 11. In FIGS. 4 and 5, the interconnector 44 is connected with the tab connector 16 of the solar cell 11 which is positioned at the upper edge side in the figure. In the interconnector 44, the insulation layer is provided at a part correspond in position to other than the connected strings 40. The interconnector 44 has one end 44a extending to the terminal box in order to connect with the bypass diode 50.

The interconnector 45 connects the adjacent strings 40 in series. In FIGS. 4 and 5, the interconnector 45 connects with the tab connector 16, which is arranged on the front surface side, extending from an upper edge of the solar cell 11 and the tab connector 16, which is arranged on the rear surface side, respectively. The interconnector 45 has one end 45a extending to the terminal box in order to connect with the bypass diode 50.

Even though the interconnectors 41, 42, 43, 44, 45 are wide and arranged on the rear surface side of the solar cell 11, loss of the light receiving area is little. Therefore, the reduced thickness of the interconnectors 41, 42, 43, 44, 45 increases the width of the interconnectors 41, 42, 43, 44, 45 in order to reduce the resistance value.

In the embodiment, a copper foil having a width of 10 mm to 35 mm and a thickness of 100 μm, which is more reduced than that of the substrate 110 of the solar cell 11 is used for the each interconnectors 41, 44, 45 connecting between the strings 40, 40.

An interconnector having a cross-sectional area of 4 mm in a width and 300 μm in a thickness is conventionally used surrounding the solar cell. When an interconnector has a thickness of 100 μm, a width of not less than 12 mm is enough to have same or not less resistance than conventional one. The interconnector 41 is preferably composed of a wide copper foil having a line width not less than 200 times a thickness. Since the interconnectors having the thickness of 20 mm to 35 mm are respectively used, this embodiment is advantageous through the view point of resistance loss.

The terminal box is arranged on a rear surface member 13 side. In the embodiment, the terminal box is arranged on a part indicated by dotted lines. On the arranged side of the terminal box, the interconnector 41 connecting between the strings 40, the interconnectors 42, 43 serving as lead-out wires to the terminal box 30, and the interconnectors 44, 45 connecting to the bypass diode 50 are provided. These interconnectors 42, 43, 44, 45 are also arranged on the rear surface side of the solar cell 11 so as not to overlap each other.

In the embodiment, a copper foil having a width of 30 mm and a thickness of 100 μm is used for the interconnector 41. A copper foil having a width of 20 mm and a thickness of 100 μm is used for the interconnector 44. A copper foil having a width of 10 mm and a thickness of 100 μm is used for the interconnector 45. A copper foil having a width of 60 mm and a thickness of 100 μm is used for the interconnectors 42, 43 serving as lead-out wires. These interconnectors are arranged leaving a space of not less than 2 mm so as to prevent from short-circuiting. When insulation is required between the interconnectors 41, 42, 43, 44, 45 and the solar cell 11, an insulator such as EVA is preferably sandwiched in between, and the interconnectors itself are preferably laminated film processed and a copper foil is preferably coated with a laminated film. While, a laminated film having self-adhesiveness can fix the insulator or the like and temporarily fix the strings 40 or the like.

In the embodiment, lead-out wires 44a, 45a of the interconnectors 44, 45 and lead-out wires 42a, 43a of the interconnectors 42, 43 serving as two lead-out wires are led out from the rear surface member 12 of the photovoltaic submodule 10, and are connected inside the terminal box.

The lead-out wires 42a, 43a of the interconnectors 42, 43 are connected with negative terminal and positive terminal, respectively. The other lead-out wires 44a, 45a are led out to the bypass diode.

In the embodiment, a copper foil of the lead-out wires 42a, 43a connecting to the terminal box has a reduced width. Since the lead-out wires 42a, 43a having the reduced width occupy only small portion, a resistance increase is reduced to a minimum.

As mentioned above, the aforementioned photovoltaic module is integrated by laminating the front surface member 12 as a sunlight incidence side light-transmitting substrate, a sealing sheet 14a composed of the EVA (Ethylene Vinyl Acetate), the strings 40 formed by the plurality of solar cells 11 connected through the tab connectors 16, the interconnectors 41, 42, 43, 44, 45 connecting between the strings, a rear surface side sealing sheet (EVA) 14b, and the rear surface material member 12, in this order.

Figure 6:
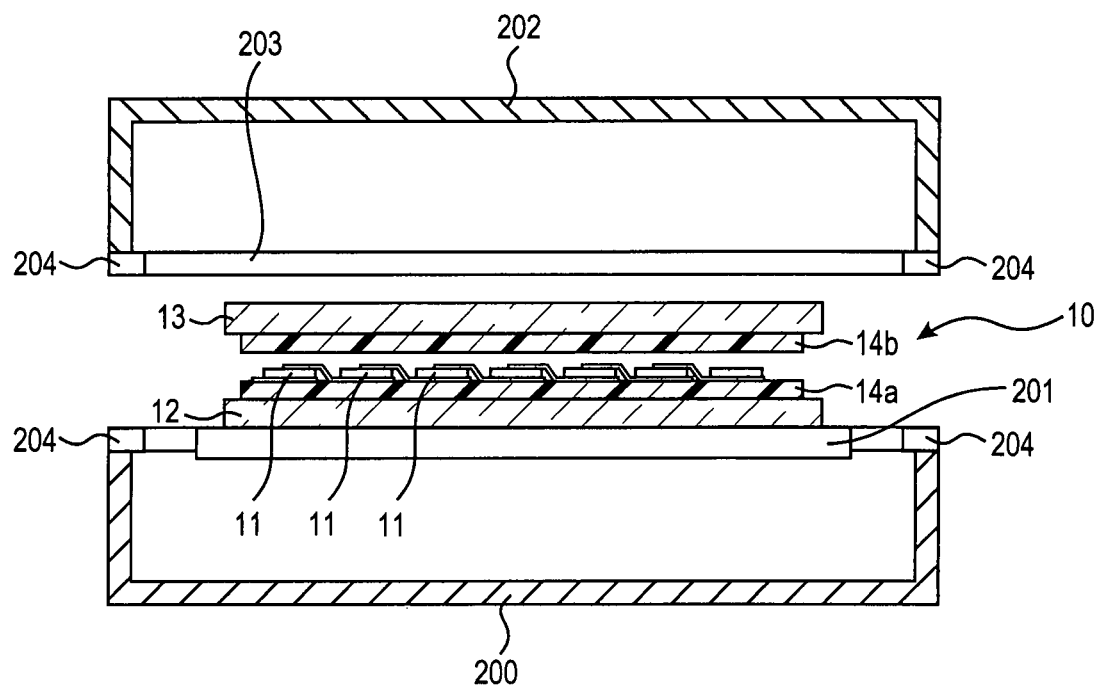
FIG. 6 is a schematic structural diagram of manufacturing equipment for manufacturing the photovoltaic submodule.

Next, a method for manufacturing the aforementioned photovoltaic submodule 10 will be described with reference to FIG. 6. FIG. 6 is a schematic structural diagram of manufacturing equipment for manufacturing photovoltaic submodule 10. Equipment used to manufacture the photovoltaic submodule 10 comprises a lower side chamber 200 and an upper side chamber 202 which will be coupled to the lower side chamber airtightly. A heating plate 201 is arranged at an upper opening of the lower side chamber 200 so that the heating plate 201 and the upper opening of the lower side chamber 200 are nearly on the same plane. The upper side chamber 202 includes a rubber diaphragm 203 arranged at a side opposed to the opening of the lower side chamber 200. A gasket 204 is arranged around the whole circumference of the lower side chamber 200 and the upper side chamber 202 in order to keep the air-tightness after the lower side chamber 200 and the upper side chamber 202 are coupled together. Additionally, a vacuum pump (not shown) is connected to the lower side chamber 200.

In order to manufacture the photovoltaic submodule 10, a light-receiving side light-transmitting substrate 12, an EVA sheet 14a (sealing sheet), tab connector 16, the plurality of solar cells 11 connected through the interconnectors 41, 42, 43, 44, an EVA sheet 14b (sealing sheet), and rear surface member 13 are laminated in this order from the bottom, on the heating plate 201 of the manufacturing equipment.

After the components are laminated on the heating plate 201 as mentioned above, the lower side chamber 200 and the upper side chamber 202 are coupled together. Then the lower side chamber 200 is evacuated by the vacuum pump (not shown), while the heating plate 201 is heated up to approximately 150 degrees C. to 200 degrees C. Under this condition, the diaphragm 203 is pressed against the photovoltaic submodule 10 placed on the heating plate 201 so that the EVA sheets 14a and 14b are gelled to be a predetermined EVA layer (sealing layer) 14. This allows the solar cells 11 placed between a front surface side light-transmitting insulating substrate 12 and a rear surface side light-transmitting insulating substrate 13 to be sealed within the EVA layer (sealing layer) 14.

During the laminating, process in the embodiment, since the interconnectors 41, 42, 43, 44, 45 are arranged so as to reduce the thickness of these to approximately one-third compared to that of the conventional interconnector and avoid overlapping each other, air bubbles are prevented from generating. Additionally, since the interconnectors 41, 42, 43, 44, 45 are thin and wide and formed, a pressing strength applied under reduced pressure is reduced and dispersed over the solar cells 11, thereby preventing the solar cell 11 from cracking due to the stress concentration.

Figure 21:
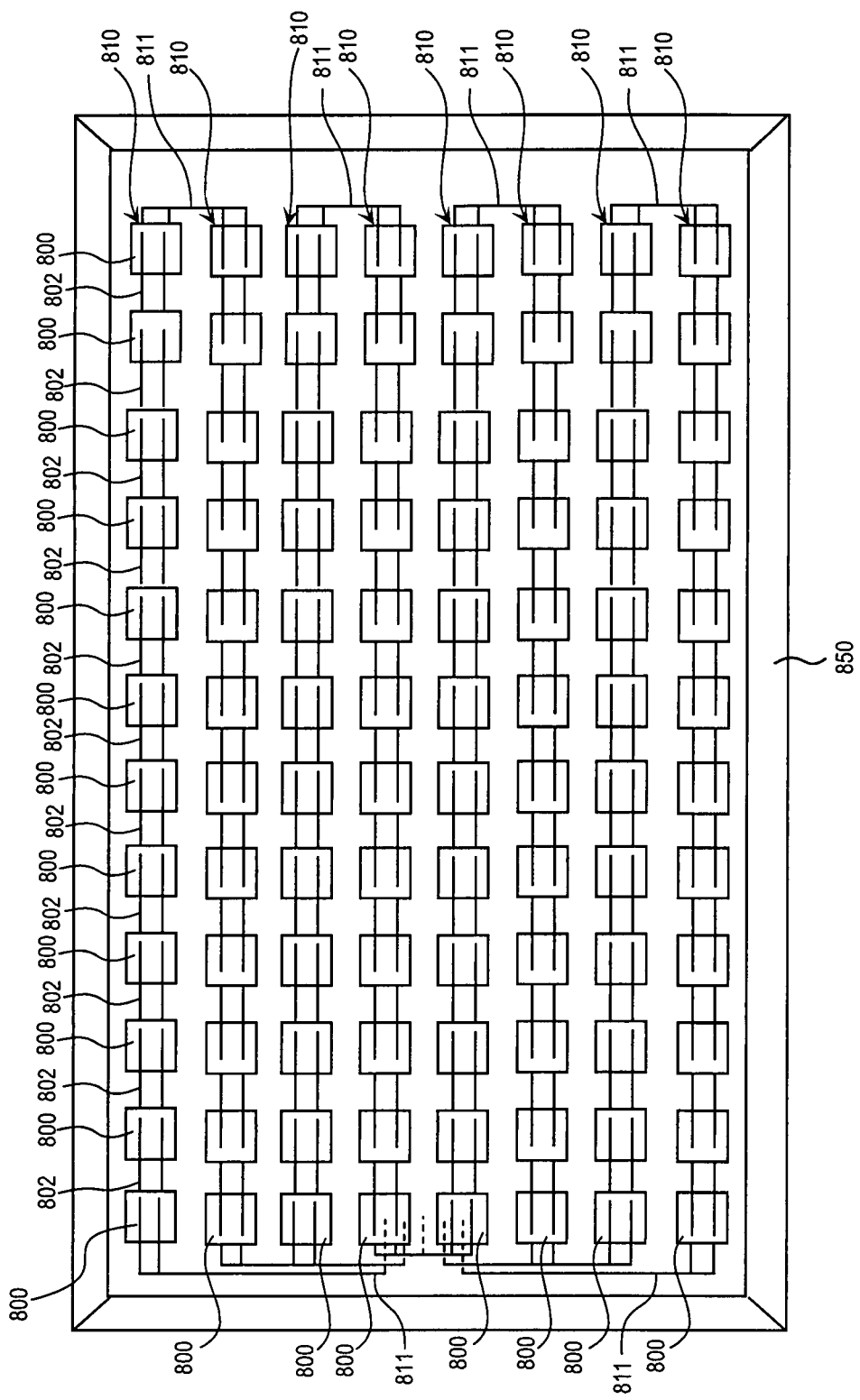
FIG. 21 is a plan view of the conventional photovoltaic module.

When the photovoltaic module in the aforementioned embodiment is formed so as to generate the same output as the conventional photovoltaic module shown in FIG. 21 in which interconnectors having a thickness of 300 μm and a width of 4 mm are arranged surrounding the solar cell (strings), the aforementioned photovoltaic module can have a reduced area occupied by the interconnectors in the light receiving area, compared to the conventional example shown in FIG. 21. Additionally, the structure allows the improvement of module efficiency, the reduction of members, and the reduction in weight. For instance, the strings formed by twelve solar cells can be reduced by 12 mm in long side. The module efficiency is improved in approximately 0.2 percent. The weight can be reduced by approximately 100 grams per a module. Regarding as system, the area can be reduced by 9.6 square meters per a thousand systems.

Next, the second embodiment of the present invention will be descried according to FIGS. 7 to 10. In the aforementioned first embodiment, the adjacent strings 40, 40 have same polarity. That is, all of the solar cells 11 are arranged to form the strings 40 so that a p-type amorphous silicon layer 113 is approached on the front surface side. While, in the second embodiment, the adjacent strings 40, 40 have reversed polarity. That is, the strings 40 are arranged in a line with the alternately reversed polarity.

Figure 7:
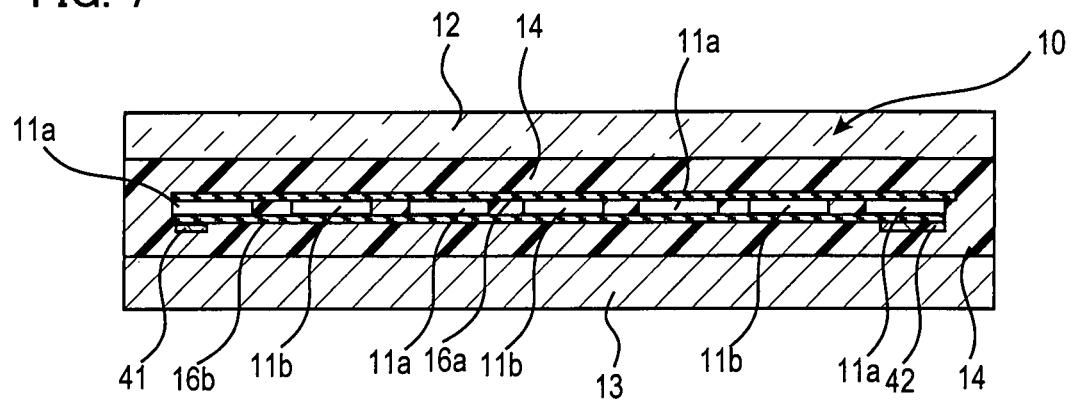
FIG. 7 is a schematic cross-sectional view illustrating the photovoltaic submodule used for the photovoltaic module in the second embodiment of the present invention.
Figure 8:
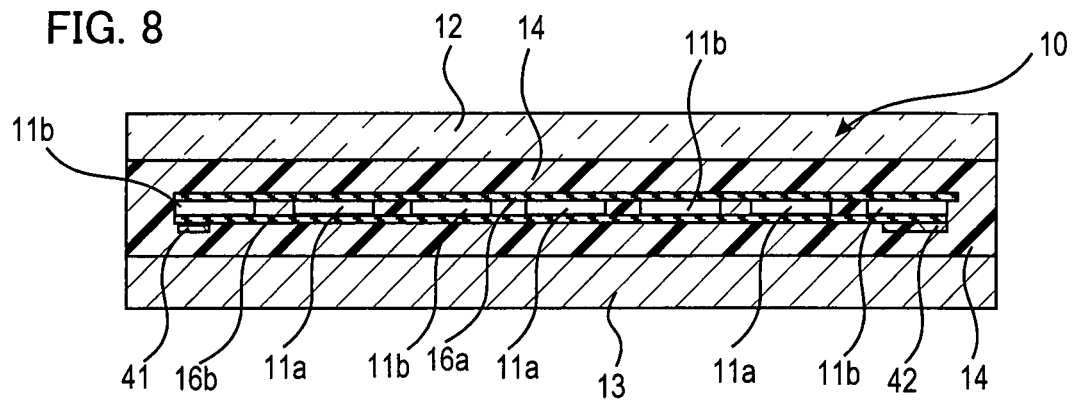
FIG. 8 is a schematic cross-sectional view illustrating the photovoltaic submodule used for the photovoltaic module in the second embodiment of the present invention.
Figure 9:
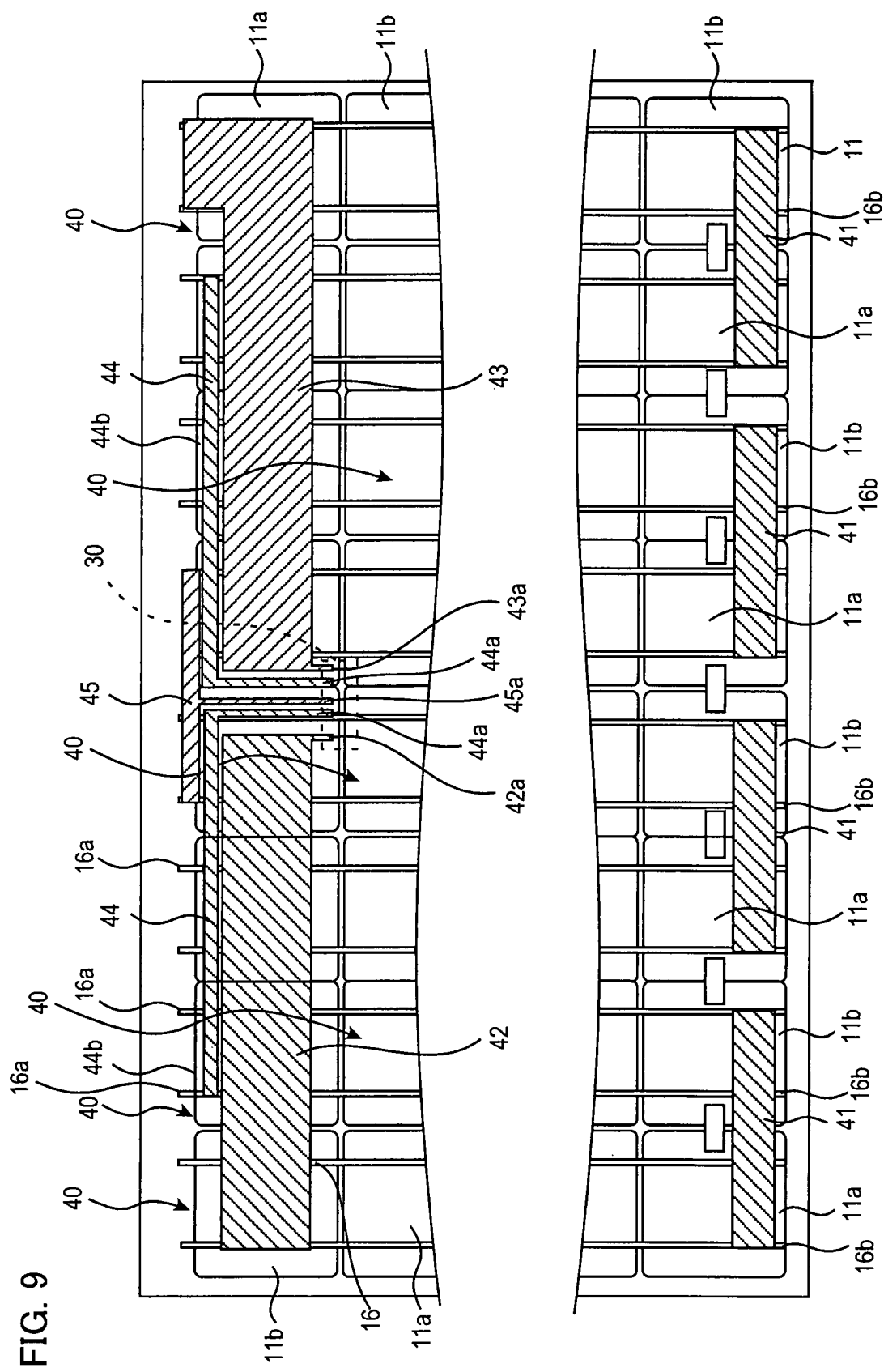
FIG. 9 is a schematic plan view seeing from the rear surface side illustrating the connection status between the strings in the second embodiment of the present invention.

FIGS. 7 and 8 are schematic cross-sectional views of the photovoltaic module according to the second embodiment of the present invention illustrating each strings connected through the interconnectors.

In FIGS. 7 and 8, solar cells 11a, 11b have same basic structure as that shown in FIG. 3. For example, the solar cell 11a is a cell used for arranging so that the p-type amorphous silicon layer 113 side faces to the light-receiving side, and the solar cell 11b is a cell used for arranging so that the n-type amorphous silicon layer 119 side faces to the light-receiving side.

The each solar cells 11a, 11b with such arrangement have predetermined a film thickness, a film material, and the like for optimal conversion efficiency.

As illustrated in FIGS. 7 and 8, the solar cells 11a and the solar cells 11b can be connected in series by alternately arranging the solar cells 11a and the solar cells 11b and connecting with each collector electrodes through tab connectors 16a, 16b. The negative electrode and the positive electrode are arranged being alternately reversed on the front surface side and the rear surface side, respectively. Therefore, the each tab connectors 16a, 16b can be linearly connected on the front surface side and the rear surface side, without being folded from the front surface side to the rear surface side as shown in the first embodiment.

Figure 10:
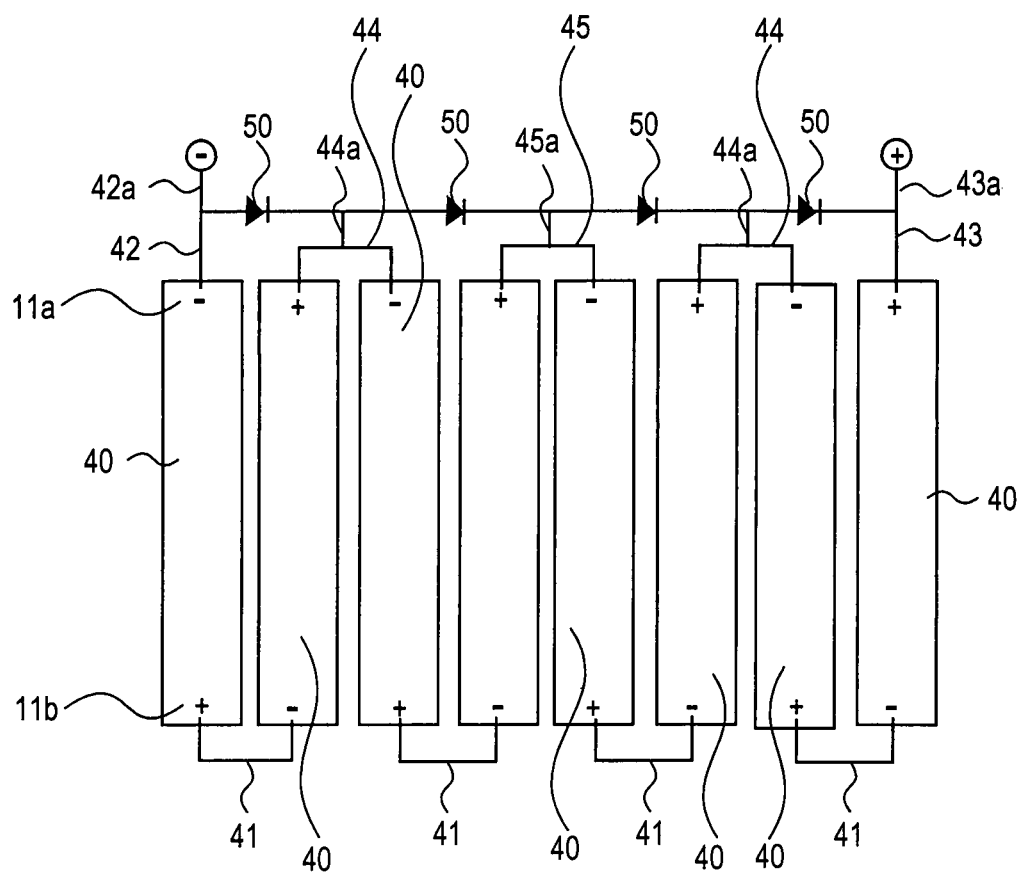
FIG. 10 is a circuit explanation view schematically illustrating the connection status between the strings in the second embodiment of the present invention.

By linearly arranging the alternately reversed polarity of the solar cells, the adjacent strings 40, 40 can be arranged with the reversed polarity as illustrated in FIG. 10.

As mentioned above, the reversed polarity at the edge of the adjacent strings 40, 40 allows the interconnector 41 to be connected on the whole rear surface side of the solar cells 11a, 11b. As a result, the interconnector 41 can have increased width and the resistance can be reduced.

The other interconnectors 42 to 45 can also have increased width.

In the aforementioned embodiment shown in FIG. 4, since the copper foil of the lead-out wire 42a, 43a of the interconnector 42, 43 are thin and formed, there is undeniably an increased resistance. While, in the third embodiment shown in FIG. 11, the leading-out part of the interconnector 42 connecting to the negative electrode and the positive electrode is remained wide so as to lead out to the terminal box 30.

Figure 11:
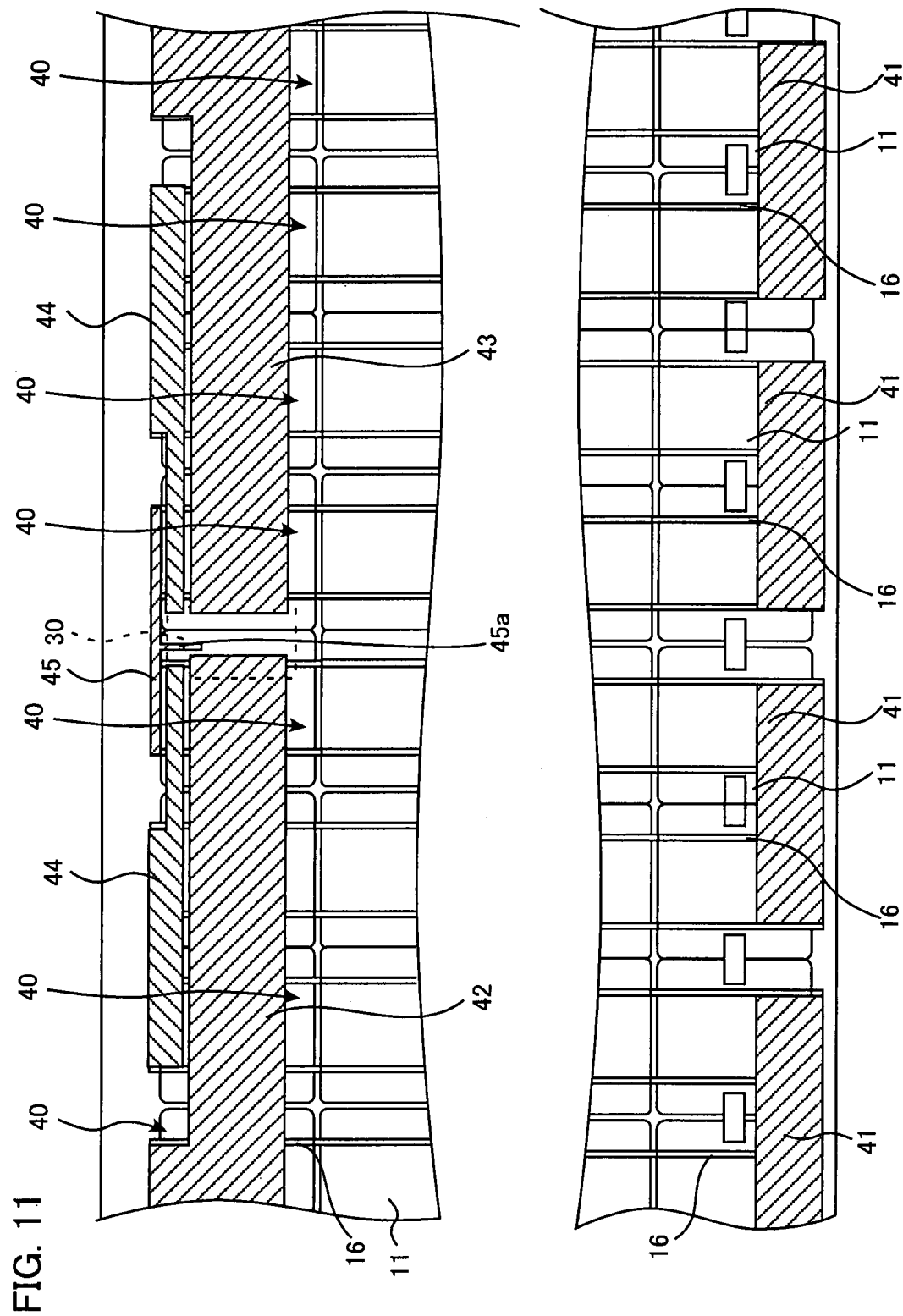
FIG. 11 is a schematic plan view seeing from the rear surface side illustrating the connection status between the strings in the third embodiment of the present invention.

In the third embodiment shown in FIG. 11, the interconnector 41 has an increased width and the connection 44b connecting with the tab connector of the interconnector 44 has an increased width. Therefore, the interconnectors 41, 44 and the interconnectors 42, 43 are partially and slightly protruded outside the solar cell 11. Then, the terminal box 30 is made large in a vertical direction, and a position where the lead-out wire connecting to the terminal box is inserted is moved to the upper edge side. Such structure can prevent the resistance increase. Although the central three wires make the leading-out part thin, a current does not flow through the three wires at the time of stationary operation. Therefore, the increased resistance does not cause a problem.

Figure 12:
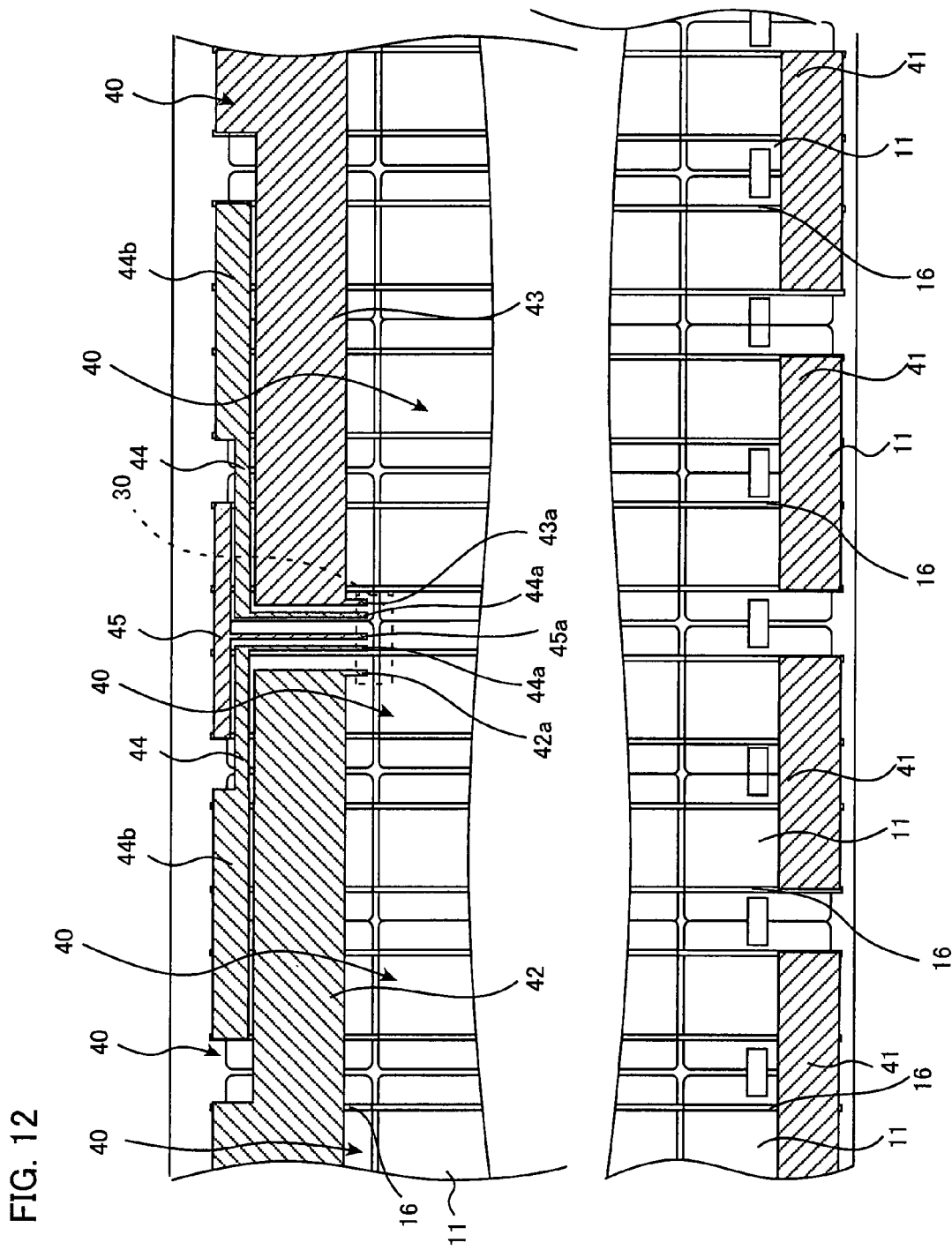
FIG. 12 is a schematic plan view seeing from the rear surface side illustrating the connection status between the strings in the fourth embodiment of the present invention.
Figure 13:
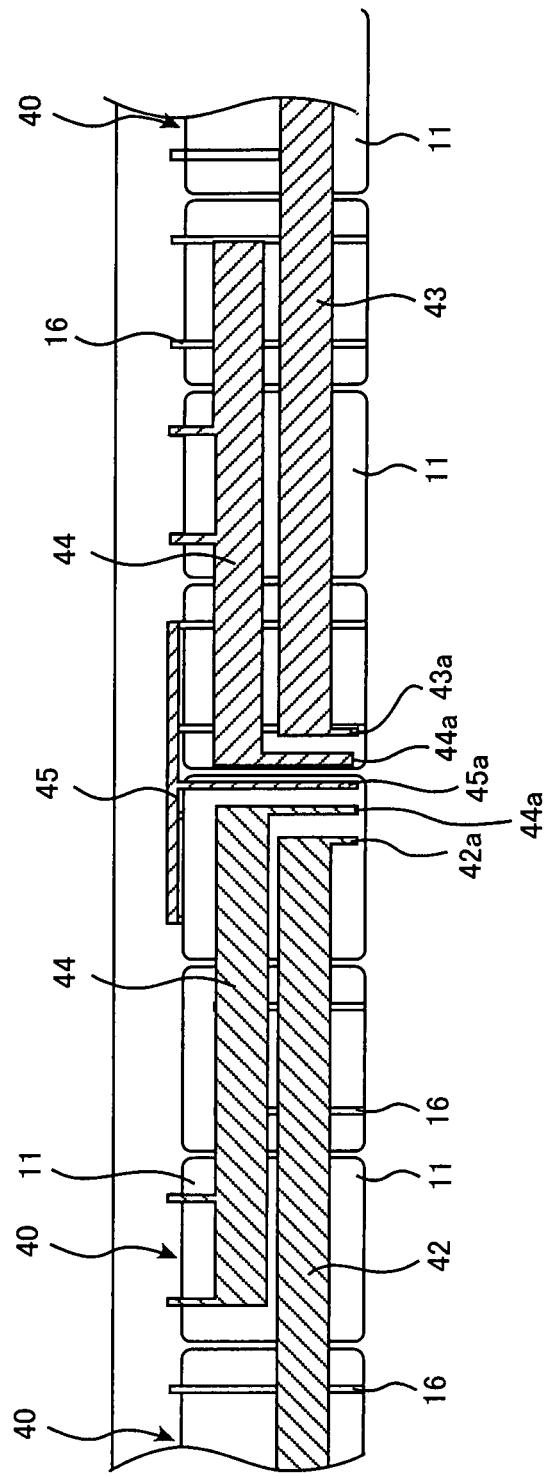
FIG. 13 is a schematic plan view seeing from the rear surface side illustrating a modified embodiment of the connection status between the strings in the embodiment of the present invention.

The fourth embodiment shown in FIG. 12 is structured similarly to FIG. 11. The difference between the embodiment shown in FIG. 12 and the embodiment shown in FIG. 13 is a shape of the terminal box 30. A terminal box shown in FIG. 12 is smaller in a vertical direction and larger in a transverse direction compared to a terminal box shown in FIG. 11. Therefore, the position where the lead-out wire is inserted is on a lower side.

Figure 14:
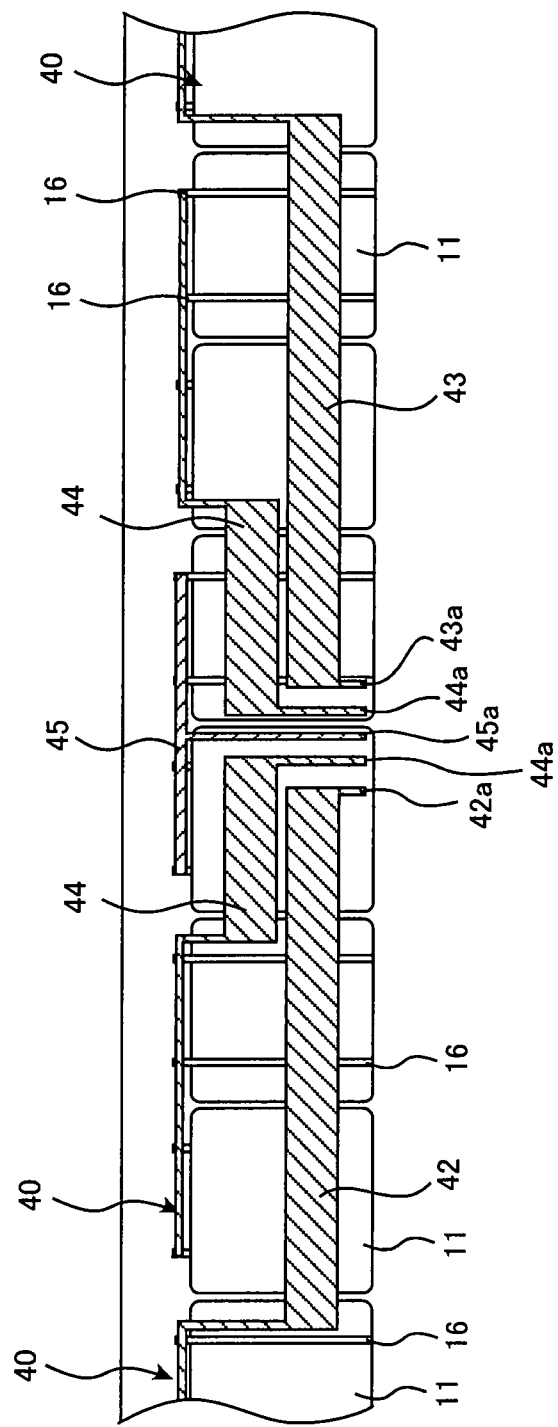
FIG. 14 is a schematic plan view seeing from the rear surface side illustrating a modified embodiment of the connection status between the strings in the embodiment of the present invention.
Figure 15:
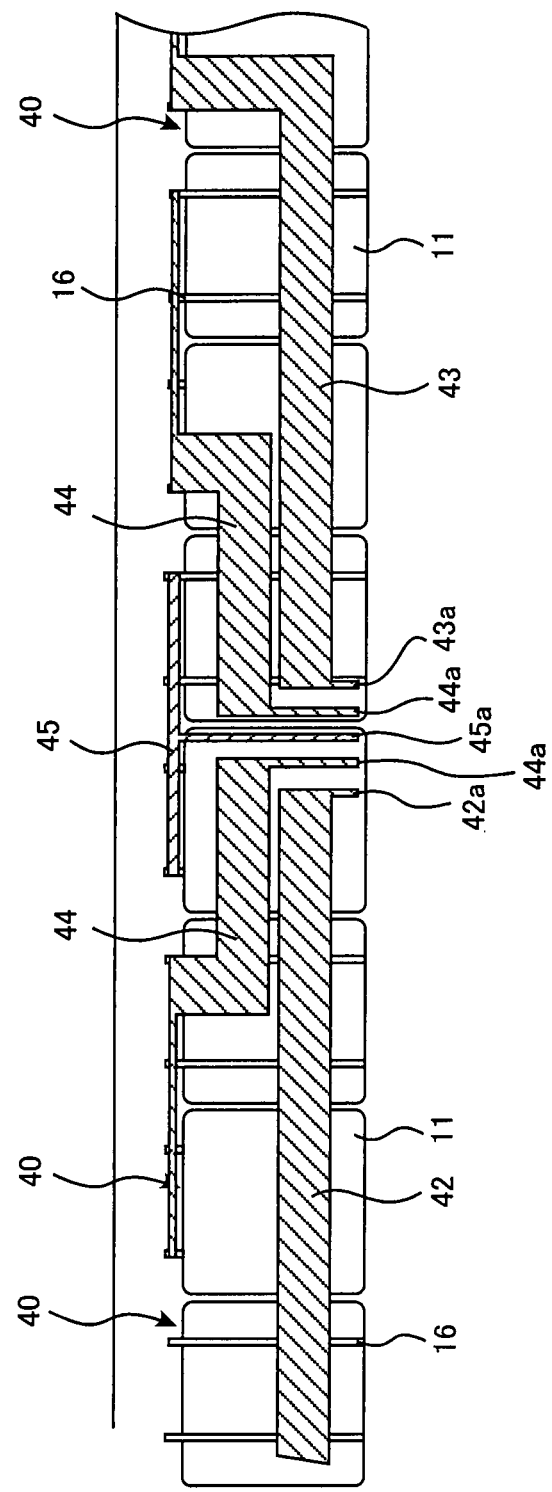
FIG. 15 is a schematic plan view seeing from the rear surface side illustrating a modified embodiment of the connection status between the strings in the embodiment of the present invention.

Next, various modified examples of the connection status between the strings 40 in the embodiment of the present invention will be described according to FIGS. 13 to 15. FIGS. 13 to 15 are schematic plan views seeing from the rear surface side illustrating the connection status between the strings 40.

As an example shown in FIG. 13, a wide interconnector 42 connecting with the negative electrode or a wide interconnector 43 connecting with the positive electrode is arranged at a lower part of the solar cell 11, while connecting with the tab connectors 16 through lead-out wires having the same width as the tab connectors 16. The interconnector 44 is similarly arranged so as to connect between strings 44, while the interconnector 44 has one end connecting with the bypass diode. The interconnector 45 is arranged so as to connect between strings 40 outside an edge of the solar cell 11 on an upper side of the interconnector 44, while having one end connecting with the bypass diode.

As an example shown in FIG. 14, the wide interconnector 42 connecting with the negative electrode or the wide interconnector 43 connecting with the positive electrode is arranged at the lower part of the solar cell 11, while connecting with the tab connector 16 on the outside of the solar cell 11. The interconnectors 42, 43 are connected with connector positioned apart from the tab connector 16. The interconnector 44 is similarly arranged so as to connect between the strings 40, while having one end connecting with the bypass diode.

As an example shown in FIG. 15, the wide interconnector 42 connecting with the negative electrode or the wide interconnector 43 connecting with the positive electrode is arranged at the lower part of the solar cell 11, while connecting with the tab connector 16 on the outside of the solar cell 11. The interconnector 42 is connected with connector arranged between the tab connectors 16. The interconnector 44 is similarly arranged so as to connect between the strings 40, while having one end connecting with the bypass diode.

In the embodiment of the present invention, an example of method for connecting between the rear surface interconnectors and the series-connected tab connectors 16 at the edge of the solar cell will be described with reference to FIGS. 16 to 19.

Figure 16:
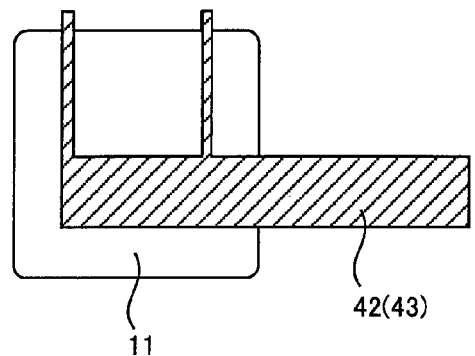
FIG. 16 is a schematic plan view illustrating an example of method for connecting between rear surface interconnectors and series-connected tab connectors at the edge of the solar cell in the embodiment of the present invention.

As an example shown in FIG. 16, connector having the same width as the tab connector 16 (for connecting the cells in series) and extending from the edge of the solar cell 11 extends from the interconnectors 42 (43). The connector connects between the interconnectors 42 (43) and the tab connector 16 at the edge of the solar cell 11.

Figure 17:
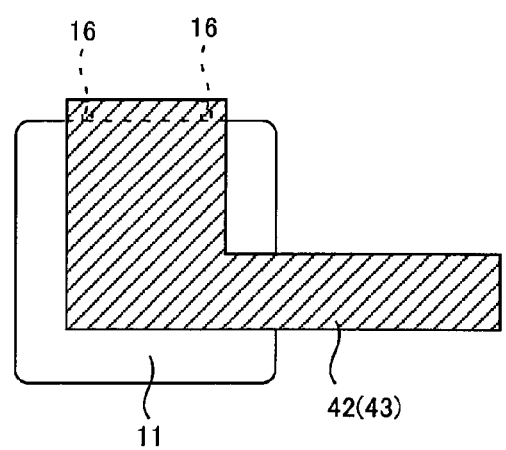
FIG. 17 is a schematic plan view illustrating an example of method for connecting between rear surface interconnectors and series-connected tab connectors at the edge of the solar cell in the embodiment of the present invention.
Figure 18:
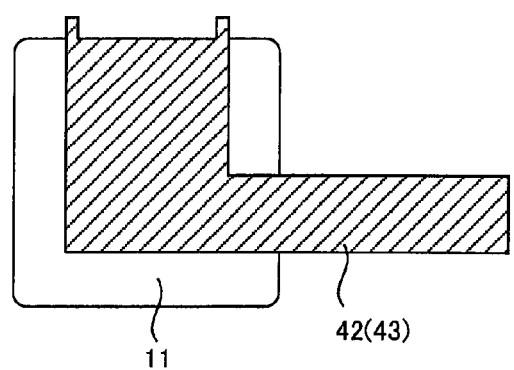
FIG. 18 is a schematic plan view illustrating an example of method for connecting between rear surface interconnectors and series-connected tab connectors at the edge of the solar cell in the embodiment of the present invention.

As an example shown in FIG. 17, connector having a width which covers the width of the two tab connectors 16 extends from the interconnectors 42 (43). The connector connects between the interconnectors 42 (43) and the tab connector 16 at the edge of the solar cell 11.

As the example shown in FIG. 17, the connector extending from the edge of the solar cell 11 has the constant width. As an example shown in FIG. 18, a part of connector extending from the edge of the solar cell has same width as the tab connector 16, while a part of the connector inside the solar cell has a width shown in FIG. 17.

Figure 19:
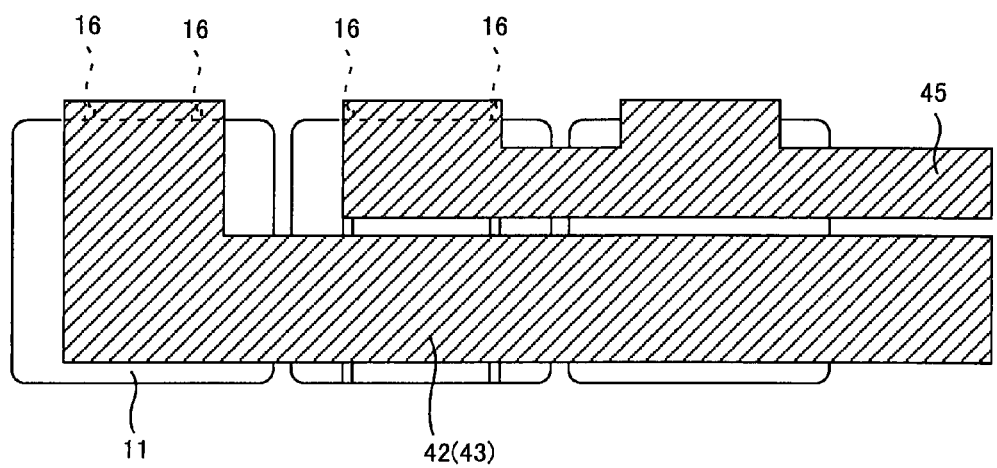
FIG. 19 is a schematic plan view illustrating an arrangement relationship of the rear surface interconnectors in the embodiment of the present invention.
Figure 20:
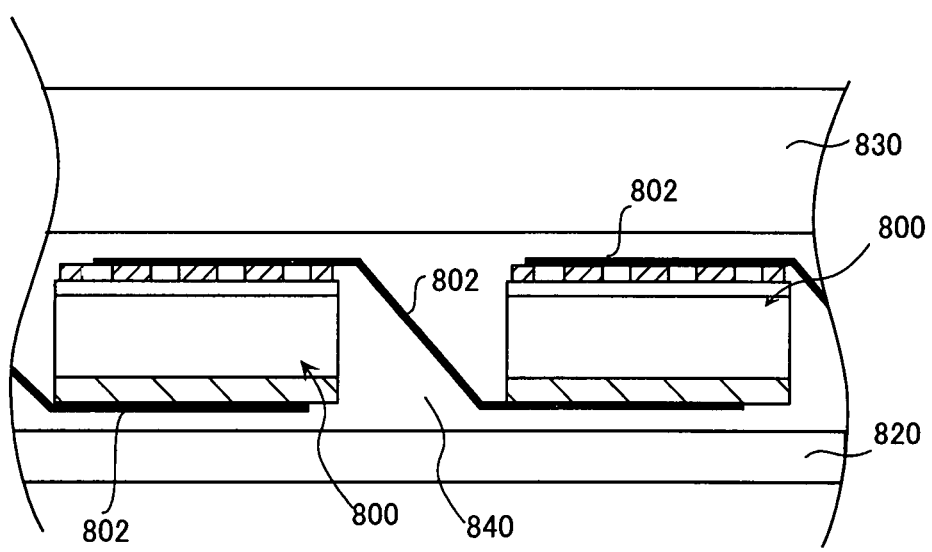
FIG. 20 is a cross-sectional view partially illustrating the structure of the conventional photovoltaic module.

As illustrated in FIG. 19, the interconnectors 42 (43), 45 are connected with the tab connector 16 by the method shown in FIG. 17. The interconnectors 42 (43), 45 are then arranged at the rear surface side of the solar cell 11 leaving a specified space so as not to overlap each other.

The present invention can be used for household power generation system, building power generation system, and the like.

It should be understood that the embodiments disclosed herein are to be taken as examples and are not limited. The scope of the present invention is defined not by the aforementioned embodiments but by the following claims. All changes that fall within meets and bounds of the claims, or equivalence of such meets and bounds are intended to be embraced by the claims.

What is claimed is:

1. A photovoltaic module comprising:
a frame with a rear surface member;
a light-transmitting substrate;
a photovoltaic sub-module comprises two or more solar cell string units, each of the two or more string units including a plurality of solar cells connected to each other by a plurality of tab connectors;
a plurality of first and second interconnectors connecting the two or more string units;
two third interconnectors with lead out wires for connecting the photovoltaic module to a terminal box; and
a sealant sealing the photovoltaic sub-module within the frame between the rear surface member and the light transmitting substrate;
wherein, each of the two or more string units has a positive electrode at one end and a negative electrode at the other end and is arranged within the photovoltaic sub-module so that a positive electrode end of one string unit is adjacent to a negative electrode end of an adjacent string unit; and
wherein,
along one side of the sub-module, the plurality of first interconnectors electrically connect the two or more string units in series by connecting the positive electrode of one string unit to a negative electrode of an adjacent string unit;
along an opposing side of the sub-module, the plurality of second interconnectors electrically connect the two or more string units in series by connecting the positive electrode of one string unit to a negative electrode of an adjacent string unit; and
each of the third interconnectors are connected to outer opposing string units and include lead-out wires; and
wherein, the first, second and third interconnectors are positioned between the rear of the photovoltaic sub-module and the rear surface member of the frame.

2. A photovoltaic module comprising:
a frame with a rear surface member;
a light-transmitting substrate;
a photovoltaic sub-module comprises two or more solar cell string units, each of the two or more string units including a plurality of solar cells connected to each other by a plurality of tab connectors;
a plurality of first and second interconnectors connecting the two or more string units; and
a sealant sealing the photovoltaic sub-module within the frame between the rear surface member and the light transmitting substrate;
wherein, each of the two or more string units has a positive electrode at one end and a negative electrode at the other end and is arranged within the photovoltaic sub- module so that a positive electrode end of one string unit is adjacent to a negative electrode end of an adjacent string unit; and
wherein,
along one side of the sub-module, the plurality of first interconnectors electrically connect the two or more string units in series by connecting the positive electrode of one string unit to a negative electrode of an adjacent string unit;
along an opposing side of the sub-module, the plurality of second interconnectors electrically connect the two or more string units in series by connecting the positive electrode of one string unit to a negative electrode of an adjacent string unit; and
wherein, the thickness of the first and second interconnectors is less than that of the light transmitting substrate, and are positioned between the rear of the photovoltaic sub-module and the rear surface member of the frame.

3. The photovoltaic module according to claim 1, wherein for the first, second and third interconnectors, a metal foil coated with a laminated film having self-adhesiveness is used.

4. The photovoltaic module according to claim 1, wherein for the interconnectors, a wide tab connector having a line width which is not less than two hundred times a film thickness is used.

5. The photovoltaic module according to claim 3, wherein for the first, second and third interconnectors, a metal foil having a film thickness which is not less than 100 µm and not more than 300 µm and a width which is not less than 20 mm and not more than 35 mm is used.

6. The photovoltaic module according to claim 1, wherein the solar cells of each unit are interconnected such that tab connectors arranged on a same surface side of adjacent solar cells having alternately reversed polarity, and
solar cells of adjacent units have alternately reversed polarity.

7. The photovoltaic module according to claim 2, wherein the first and second interconnectors are arranged on the rear surface side of the solar cell so as not to overlap each other.

8. The photovoltaic module according to claim 7, wherein for the first and second interconnectors, a metal foil coated with a laminated film having self-adhesiveness is used.

9. The photovoltaic module according to claim 7, wherein for the first and second interconnectors, a wide tab connector having a line width which is not less than two hundred times a film thickness is used.

10. The photovoltaic module according to claim 7, wherein for the first and second interconnectors, a metal foil having a film thickness which is not less than 100 μm and not more than 300 μm and a width which is not less than 20 mm and not more than 35 mm is used.

11. The photovoltaic module according to claim 2, wherein the unit is interconnected through tab connectors with solar cells arranged on same surface side having alternately reversed polarity, and solar cells of adjacent units have alternately reversed polarity.

12. The photovoltaic module according to claim 1, wherein the third interconnectors are wider than the first and second interconnectors, and the first, second and third interconnectors are facing the rear surface members and are arranged on the rear surface side of the solar cell.

* * * * *